United States Patent
Moench et al.

(10) Patent No.: US 11,563,306 B2
(45) Date of Patent: Jan. 24, 2023

(54) SEGMENTED VERTICAL CAVITY SURFACE EMITTING LASER

(71) Applicant: TRUMPF Photonic Components GmbH, Ulm (DE)

(72) Inventors: Holger Joachim Moench, Ulm (DE); Stephan Gronenborn, Ulm (DE)

(73) Assignee: TRUMPF PHOTONIC COMPONENTS GMBH, Ulm (DE)

( * ) Notice: Subject to any disclaimer, the term of this patent is extended or adjusted under 35 U.S.C. 154(b) by 246 days.

(21) Appl. No.: 16/895,017

(22) Filed: Jun. 8, 2020

(65) Prior Publication Data

US 2020/0303902 A1 Sep. 24, 2020

Related U.S. Application Data

(63) Continuation of application No. PCT/EP2018/083833, filed on Dec. 6, 2018.

(30) Foreign Application Priority Data

Dec. 8, 2017 (EP) .................................. 17206157

(51) Int. Cl.
*H01S 5/183* (2006.01)
*H01S 5/042* (2006.01)
*H01S 5/062* (2006.01)

(52) U.S. Cl.
CPC ........ *H01S 5/18319* (2013.01); *H01S 5/0421* (2013.01); *H01S 5/06203* (2013.01);
(Continued)

(58) Field of Classification Search
CPC ............... H01S 5/18319; H01S 5/0421; H01S 5/18311; H01S 5/18313; H01S 5/18322;
(Continued)

(56) References Cited

U.S. PATENT DOCUMENTS 6,061,381 A 5/2000 Adams et al.
6,507,595 B1 * 1/2003 Kapon .................... H01S 5/423
372/45.01

(Continued)

FOREIGN PATENT DOCUMENTS

CN 103579901 A 2/2014
EP 1501162 A2 1/2005
(Continued)

*Primary Examiner* — Yuanda Zhang
(74) *Attorney, Agent, or Firm* — Leydig, Voit & Mayer, Ltd.

(57) ABSTRACT

A VCSEL device includes a first electrical contact, a substrate, a second electrical contact, and an optical resonator arranged on a first side of the substrate. The optical resonator includes a first reflecting structure comprising a first distributed Bragg reflector, a second reflecting structure comprising a second distributed Bragg reflector, an active layer arranged between the first and second reflecting structures, and a guiding structure. The guiding structure is configured to define a first relative intensity maximum of an intensity distribution within the active layer at a first lateral position such that a first light emitting area is provided, to define at least a second relative intensity maximum of the intensity distribution within the active layer at a second lateral position such that a second light emitting area is provided, and to reduce an intensity in between the at least two light-emitting areas during operation.

17 Claims, 8 Drawing Sheets

(52) U.S. Cl.
CPC ...... *H01S 5/18305* (2013.01); *H01S 5/18311* (2013.01); *H01S 5/18313* (2013.01); *H01S 5/18322* (2013.01); *H01S 5/18327* (2013.01); *H01S 5/18361* (2013.01); *H01S 5/18383* (2013.01)

(58) Field of Classification Search
CPC ............. H01S 5/18327; H01S 5/18361; H01S 5/18383
See application file for complete search history.

(56) References Cited

U.S. PATENT DOCUMENTS

| | | |
|---|---|---|
| 9,780,532 B1 | 10/2017 | Tabataba-Vakili et al. |
| 2003/0031218 A1 | 2/2003 | Yeh |
| 2008/0219307 A1 | 9/2008 | Birkedal et al. |
| 2014/0023104 A1 | 1/2014 | Suzuki et al. |
| 2017/0033535 A1 | 2/2017 | Joseph |
| 2017/0302059 A1 | 10/2017 | Gerlach et al. |
| 2017/0317474 A1 | 11/2017 | Johnson et al. |

FOREIGN PATENT DOCUMENTS

| | | |
|---|---|---|
| WO | WO 2008043526 A1 | 4/2008 |
| WO | WO 2016162236 A1 | 10/2016 |

\* cited by examiner

SEGMENTED VERTICAL CAVITY SURFACE EMITTING LASER

CROSS-REFERENCE TO PRIOR APPLICATIONS

This application is a continuation of International Patent Application No. PCT/EP2018/083833, filed on Dec. 6, 2018, which claims priority to European Patent Application No. EP 17 206 157.4, filed on Dec. 8, 2017. The entire disclosure of both applications is hereby incorporated by reference herein.

FIELD

The invention relates to a segmented Vertical Cavity Surface Emitting Laser (VCSEL) device comprising a guiding structure arranged to provide separated optical modes. The invention further relates to an optical sensor comprising such a VCSEL device and a mobile communication device comprising such an optical sensor. The invention further relates to a corresponding method of fabricating such a VCSEL device.

BACKGROUND

Addressable arrays of VCSELs are of increasing importance in the field of sensors for depth imaging as well as for printing/additive manufacturing. Depending on the application it cannot be tolerated if one single pixel fails. Such a single pixel failure would cause a total device failure. This makes pixelated arrays comprising large VCSELs (large light emitting area) unfavorable because the rate of single pixel failures increases with the size of the VCSEL.

US 2017/0302059 A1 discloses a VCSEL and a method of manufacturing such a VCSEL. The VCSEL comprises a first electrical contact, a substrate, a first distributed Bragg reflector, an active layer, a distributed heterojunction bipolar phototransistor, a second distributed Bragg reflector and a second electrical contact, the distributed heterojunction bipolar phototransistor comprising a collector layer, a light sensitive layer, a base layer and an emitter layer, wherein the distributed heterojunction bipolar phototransistor is arranged such that there is an optical coupling between the active layer and the distributed heterojunction bipolar phototransistor for providing an active carrier confinement by means of the distributed heterojunction bipolar phototransistor such that an optical mode of the VCSEL is self-positioning in accordance with the active carrier confinement during operation of the VCSEL.

U.S. Pat. No. 6,061,381 A discloses a VCSEL which includes a resonant cavity formed between a distributed Bragg reflector formed of semiconductor material and an overlying distributed Bragg reflector formed of dielectric material. The resonant cavity contains a layer of laser active material sandwiched between spacer layers and a blocking layer which confines an energizing electric current to flow through the cavity between a metallic contact layer on the underside of the Bragg reflector and a contract. In order to support a preselected resonant mode, a series of concentric rings is formed in the blocking layer surrounding the resonant cavity so as to provide a Bragg structure which reflects light from the cavity with a phase characteristic that supports the preselected transverse resonant mode.

SUMMARY

In an embodiment, the present invention provides a Vertical Cavity Surface Emitting Laser (VCSEL) device. The VCSEL device includes a first electrical contact, a substrate, a second electrical contact, and an optical resonator arranged on a first side of the substrate. The optical resonator includes a first reflecting structure comprising a first distributed Bragg reflector, a second reflecting structure comprising a second distributed Bragg reflector, an active layer arranged between the first reflecting structure and the second reflecting structure, and a guiding structure. The guiding structure is configured (i) to define a first relative intensity maximum of an intensity distribution within the active layer at a first lateral position of the optical resonator such that a first light emitting area is provided, (ii) to define at least a second relative intensity maximum of the intensity distribution within the active layer at a second lateral position of the optical resonator such that a second light emitting area is provided, and (iii) to reduce an intensity of the intensity distribution in between the at least two light-emitting areas during operation of the VCSEL device. The guiding structure is arranged within a layer stack of the first distributed Bragg reflector or the second distributed Bragg reflector and arranged within and fully enclosed by the optical resonator. A first optical mode contributes to the first relative intensity maximum and a second optical mode, which is different from the first optical mode, contributes to the second relative intensity maximum.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following.

DETAILED DESCRIPTION

The present disclosure describes VCSEL devices with high output power and improved reliability.

According to a first aspect a VCSEL device is provided. The VCSEL device comprises a first electrical contact, a substrate, a second electrical contact and an optical resonator. The optical resonator is arranged on a first side of the substrate. The optical resonator comprises a first reflecting structure comprising a first distributed Bragg reflector (DBR), a second reflecting structure comprising a second DBR, an active layer arranged between the first reflecting structure and the second reflecting structure and a guiding structure. The guiding structure is configured to define a first relative intensity maximum of an intensity distribution within the active layer at a first lateral position of the optical resonator such that a first light emitting area is provided. The guiding structure is further configured to define at least a second relative intensity maximum of the intensity distribution within the active layer at a second lateral position of the optical resonator such that a second light emitting area is provided. A first optical mode is contributing to the first relative intensity maximum and a second optical mode, which is different from the first optical mode, is contributing to the second relative intensity maximum. The guiding structure is arranged within (inside) a layer stack of the first DBR or the second DBR and arranged within and fully enclosed by the optical resonator. The guiding structure is additionally be configured to reduce an intensity of the intensity distribution in between the at least two (or more) light-emitting areas during operation of the VCSEL device. Lasing is inhibited in between the two, three, four or more light emitting areas. The two, three, four or more in a relative intensity maxima are separated or to be more precise essentially independent from each other. Different optical modes (two, three four or more) contribute to the relative intensity maxima at different lateral positions. The guiding structure may be arranged to reduce an intensity of at least one optical mode contributing to at least one of the first or second relative intensity maximum outside the at least the first or the second light emitting area such that a lateral extension of the light emitting areas is bound to the respective lateral position of the optical resonator. The first and the second electrical contact are arranged to electrically pump the active layer. The first or the second reflecting structure may comprise reflective elements which are not comprised by the first or the second DBR contributing to the total reflectivity of the first or second reflecting structure. The active layer may comprise two, three, four or more light-emitting areas across the lateral extension of the active layer which defined by means of the guiding structure. The layer stack of the optical resonator arranged on the first side of the substrate is characterized by a thickness of between 5-20 µm. The substrate is usually characterized by thickness of between 100-600 µm such that a second side of the substrate opposing the first side is separated from the first side by at least 100 µm.

The term "Vertical Cavity Surface Emitting Laser" also includes so-called Vertical External Cavity Surface Emitting Lasers (VECSEL). The abbreviation VCSEL is used for both types of lasers. The term "layer" does not exclude that the layer comprises two or more sub-layers.

Addressable arrays of VCSELs or VCSEL devices are of increasing importance in the field of sensors for depth imaging as well as for printing/additive manufacturing. Depending on the application it cannot be tolerated if one single pixel fails. Such a failure would cause a total device failure.

VCSEL devices can fail because defects develop in the crystal, which absorb part of the laser radiation and drive up the laser threshold. By such absorption the local temperature at the defect region increases and the defects grow, leading to even higher absorption and finally a total failure.

Even in large diameter VCSEL devices, the individual locations in the aperture are connected by the optical modes either having an intensity profile across the whole aperture or plane waves travelling across the whole aperture. A local defect would therefore absorb optical power provided by optical modes with intensity profile across the active area or plane waves traveling across the active area.

For this reason, "workarounds" use a small array for one pixel, each element of the array (VCSEL with small active area) is imaged by the help of optics onto a single pixel in the application. This requires a significant effort and space which is not feasible for mass applications.

Especially bottom emitting VCSELs devices emitting laser light through the substrate with a full metal anode contact can be scaled to relatively large diameter (total active area of more than 200 µm$^2$, more preferably more than 400 µm$^2$ and most preferably more than 600 µm$^2$) in order to enable higher power applications. Flip-chip mounting of the bottom emitter on an electronic driver allows individual "pixel" addressing. Such architecture is most compact but not used today because of the reliability issue discussed above.

The VCSEL device according to claim 1 enables making of a large area VCSEL device with an optical separation of different light emitting areas across the aperture. Relative maxima of the intensity distribution stay in defined parts of the aperture or active area and do not intermix. An advantage of separation of light emitting areas across the lateral extension of the active area of the connected active layer is that a single region of such a light emitting area failing will cause the respective light emitting area of the device to stop lasing. Therefore the optical intensity in this region is reduced (and because of the separation other regions do not bring in their intensity) and local heating by absorption is avoided. The defect will not propagate further and the damage remains localized. The intensity distribution is therefore such that there is essentially no energy transfer between especially neighboring light-emitting areas and the corresponding relative intensity maxima. Each relative intensity maxima and contributing optical mode or modes gets the majority of its gain from the associated lateral position within the optical resonator (position of the associated light emitting area) and only minority from neighboring regions.

A size of the light-emitting areas is at least 3 µm$^2$. The light emitting areas are comprised by an active area of the active layer of at least 200 µm$^2$.

The guiding structure may be a localized element consisting of, for example one single layer of the optical resonator. The guiding structure may alternatively comprise a multitude of layers interacting such that (as well as the single localized element) separated relative intensity maxima of two, three, four or more light-emitting areas are bound to the respective location in the optical resonator.

The guiding structure may be arranged inside a layer stack of the first distributed Bragg reflector or the second distributed Bragg reflector in a vertical direction of the Vertical Cavity Surface Emitting Layer device. The vertical direction may refer to a vertical direction of the vertical cavity of the Vertical Cavity Surface Emitting Laser device.

The guiding structure is arranged within and completely surrounded by the optical resonator. The guiding structure is arranged inside the optical resonator, in particular inside the first DBR or inside the second DBR. The guiding structure is arranged within and fully enclosed by the first DBR or the second DBR. The guiding structure is arranged within a layer stack of the first DBR or the second DBR such that the optical guiding structure is surrounded of encapsulated by the first or the second DBR. An advantage of this approach may be a more homogeneous growth process of adjacent layers, e.g. between the active layer and a layer of the first or second DBR. The guiding structure may be arranged such that at least one layer (or a sequence of at least two layers) of the layer stack of the first and/or second DBR is arranged in contact with the guiding structure and wherein and wherein said DBR layer or layer sequence in contact with the guiding structure is arranged in a vertical direction of the vertical cavity of the Vertical Cavity Surface Emitting Laser.

At least a first layer of the first DBR may be arranged above the guiding structure in a vertical direction of the vertical cavity of the Vertical Cavity Surface Emitting Laser and at least a second layer of the first DBR may be arranged below the guiding structure in a vertical direction of the vertical cavity of the Vertical Cavity Surface Emitting Laser. The same may apply for the second DBR.

An advantage of the guiding structure being arranged within (inside) a layer stack of the first DBR or the second DBR can be an improved structural integrity of the device. Hence, the device may be better suited for harsh application scenarios, more stable regarding vibrations and/or may offer an improve reliability for example in automotive applications. For example, a (single) mesa structure may be provided that comprises the guiding structure rather than providing separate mesas that a separated by trenches and/or electrical contacts in between the separate mesas.

The guiding structure may, for example, be arranged to provide a lateral variation of a reflectivity of the first reflecting structure or the second reflecting structure parallel to the active layer. The lateral variation of the reflective may be provided by means of a single layer or a combination of two or more layers. The guiding structure may, for example, be arranged within a layer stack of the first DBR or the second DBR. The guiding structure may comprise a variation of a thickness of at least one layer of the first DBR reflector or the second DBR. The guiding structure may alternatively or in addition comprise a lateral variation of a reflectivity of the first electrical contact or the second electrical contact.

The guiding structure may alternatively or in addition comprise oxidized regions within at least one layer of the first distributed Bragg reflector or the second distributed Bragg reflector. The oxidized region are arranged to reduce the intensity in between the at least two light-emitting areas. The oxidized region may be arranged to change the resonance conditions within the optical resonator in a lateral direction and/or to provide a local current confinement of the electrical current at the locations of the light emitting areas. The oxidized region may, for example, be arranged within an oxide aperture surrounding the at least two light emitting areas.

The optical resonator may further comprise a phototransistor (PT) or distributed heterojunction bipolar phototransistor (HPT). The HPT comprises a collector layer, a light sensitive layer, a base layer and an emitter layer. The HPT is arranged such that there is an optical coupling between the active layer and the HPT for providing an active carrier confinement by means of the HPT.

The usage of a (monolithically integrated) HPT especially close to the active layer may enable an efficient charge carrier confinement by controlling the carrier injection as a function of the local intensity of the actual profile of the lasing mode which is influenced by optical guiding provided by means of the optical guiding structure. As a result, the carrier injection may be adapted locally to the demand of the lasing mode and vice versa. The HPT effectively acts as a current confinement layer or structure. The advantage of the addition of the phototransistor is that it turns a slight optical modulation into a strong differentiation of lasing and non-lasing areas and inhibits current flow in between the segmented regions thus increasing efficiency. The HPT therefore supports the separation of the optical modes by amplifying, for example, slight optical guiding provided by the guiding structure.

The HPT with optical sensitive collector-base junction may be designed to avoid optical absorption. The light sensitive layer may be a quantum well layer or a bulk layer. Bulk layers are, for example, homogeneous layers with a thickness of 10 nm or more in which quantum mechanic effects can be neglected.

The HPT is arranged within the VCSEL such that the sensitivity with respect to light which is generated by means of the active layer of the VCSEL in combination with the optical resonator provided by the first and second DBR is sufficiently high. The HPT may, for example, be a pnp HPT which is arranged directly above the active layer meaning at the side of the active layer which is turned away from the usually n-conducting substrate. In an alternative approach it may be possible to arrange an npn HPT directly below the active layer. Directly means in this respect that the pnp HPT or the npn HPT is arranged as near as possible to the active layer. This does not exclude that there is one or more intermediate layer which may be needed to improve, for example, the performance and/or reliability of the VCSEL. It may also be possible to stack the HPT in the first or the second DBR after, for example, three or five pairs of mirror layers. The layer structure of the HPT may even be integrated in one of the DBRs. The thickness of one or more of the HPT layers may be adapted to the emission wavelength of the VCSEL (quarter wavelength layer) in the respective material. One or more layers of the HPT may in this case be used to increase the reflectivity of the respective DBR. It may even be possible to use two HPTs one below and one above the active layer.

Positioning of the HPT directly above or below the active layer may have the advantage that due to the low lateral conductivity between the HPT and the active layer the optical mode fits best to the profile of the respective charge carriers.

The concentration of dopants in the collector layer, the base layer and the emitter layer may be less than $10^{19}$ cm$^{-3}$. The dopants of the layers of the HPT cause optical losses such that a low doping level is preferred. The emitter layer of the HPT is the layer with the highest doping concentration. The concentration of dopants in the emitter layer may be, for example as low as $5*10^{18}$ cm$^3$ or even $2*10^{18}$ cm$^3$. The concentration of dopants may be as low as $1*10^{18}$ cm$^3$ in the base layer and $4*10^{17}$ cm$^{-3}$ in the collector layer in case of a concentration of dopants of $2*10^{18}$ cm$^3$ in the emitter layer in order to reduce optical losses by means of the charge carriers.

The thickness of the base layer may be 100 nm or less. The HPT may be a pnp HPT which is arranged between the active layer and the second DBR. The base layer may in this case have a thickness of around $\lambda/4$ of the emission wavelength of the VCSEL in the material of the base layer.

The emission wavelength may depend on the material of the substrate. A GaAs substrate may be used for an emission wavelength between 650 nm and around 1600 nm. A VCSEL with an InP substrate may emit laser light at an emission wavelength of more than or even much more than 1500 nm. The thickness of the collector layer may be in the range of $\lambda/2$ of the emission wavelength of the VCSEL in the material.

The guiding structure may be arranged outside a current flow which can be provided by means of the first electrical contact and the second electrical contact during operation of the VCSEL device. Optical confinement by means of the guiding structure does not directly interact with the current confinement provided by means of the HPT. The current flow is not disturbed by means of the guiding structure. There may be an indirect interaction because the optical guiding determines positioning of the relative intensity and therefore the area or more precise the volume in which the HPT gets conductive. Separation of in this case optical guiding and current confinement may enable a defined position of the separated relative intensity maxima. Channeling of the electrical current by means of the HPT improves efficiency and the HPT inhibits a current along non-lasing parts which may be caused by a local failure of one of the layers of the VCSEL device.

The guiding structure may, for example, be arranged to provide across the lateral cross section of the optical resonator regions with an effective optical length enabling resonant laser operation intermitted by regions with a different effective optical length inhibiting laser operation.

The guiding structure may, for example, be arranged to reduce the effective optical length of the optical resonator at the regions where resonant laser operation is inhibited. A reduction of the effective optical lengths may, for example, be enabled by local oxidization of one or more layer of the first or the second DBR as described above.

The guiding structure may alternatively or in addition be arranged to increase the effective optical length of the optical resonator at the regions where resonant laser operation is enabled. An additional structured layer (e.g. $SiO_2$ or $SiN_x$) may be provided or a thickness of one or more semiconductor layer (e.g. one or more $Al_yGa_{(1-y)}As$-layer) may be structured in order to change resonance conditions in the lateral direction of the optical resonator. The guiding structure may be embedded in the layer structure of the first or second DBR. The corresponding DBR may in this case be a dielectric DBR comprising pairs of non-conducting dielectric layers with different refractive indices as, for example, $Nb_2O_5$, $TiO_2$, $TaO_2$, $Si_3N_4$ and $SiO_2$ layers.

The guiding structure may alternatively or in addition be arranged to provide a local current confinement at the at least two light-emitting areas. The guiding structure may, for example, comprise the first or the second electrode, wherein the first or the second electrode is arranged to induce an electrically current distribution in accordance with the intensity distribution across the active layer. The first or second electrode may, for example, be structured in order to enable local current induction. The guiding structure may alternatively or in addition comprise at least one layer with reduced lateral electrical conductivity in areas corresponding to an area of decreased intensity in between the at least two light-emitting areas. A doping profile of one or more semiconductor layer may, for example, be arranged such that electrical conductivity to the light emitting areas is increased and electrical conductivity of the areas between the light emitting areas is decreased.

The VCSEL device may be arranged to emit laser light through the substrate (bottom emitter). Bottom emitters enable rather large active areas as described above. The bottom emitter or the optical resonator may comprise an extended optical cavity across the substrate. The guiding structure may comprise a lateral structuring of a second side of the substrate opposing the first side of the substrate. The guiding structure may alternatively or in addition comprise further layers deposited on the second side of the substrate supporting guiding of the separate relative intensity maxima (providing a lateral variation of optical feedback within the extended optical cavity).

The VCSEL device may be comprised by an optical sensor. The optical sensor may be comprised by a mobile communication device. The optical sensor may alternatively be used in automotive applications especially for autonomous driving. The VCSEL device may be further used in array arrangements for, for example, printing or high power applications like additive manufacturing.

According to a further aspect a method of fabricating a Vertical Cavity Surface Emitting Laser is provided. The method comprises the steps of: providing a first electrical contact, providing a substrate, providing a first DBR, providing an active layer, providing a second DBR, providing a second electrical contact, and providing a guiding structure which is configured to define a first relative intensity maximum of an intensity distribution within the active layer at a first lateral position of the optical resonator such that a first light emitting area is provided. The guiding structure is configured to define at least a second relative intensity maximum of the intensity distribution within the active layer at a second lateral position of the optical resonator such that a second light emitting area is provided, wherein a first optical mode is contributing to the first relative intensity maximum and a second optical mode, which is different from the first optical mode, is contributing to the second relative intensity maximum. The guiding structure is further configured to reduce an intensity of the intensity distribution in between the at least two light-emitting areas during operation of the Vertical Cavity Surface Emitting Laser device. The guiding structure is arranged within a layer stack of the DBR or the second DBR and arranged within and fully enclosed by the optical resonator.

The steps need not necessarily be performed in the order given above. The guiding structure may, for example, be comprised by the first electrical contact, the first DBR, the second DBR or the second electrical contact. The substrate may optionally be removed. The different layers may be deposited by epitaxial methods like metal organic chemical vapor deposition (MOCVD), molecular beam epitaxy (MBE), and the like.

It shall be understood that the VCSEL device described above and the method have similar and/or identical embodiments.

Further advantageous embodiments are defined below.

In the Figures, like numbers refer to like objects throughout. Objects in the Figures are not necessarily drawn to scale.

Figure 1:
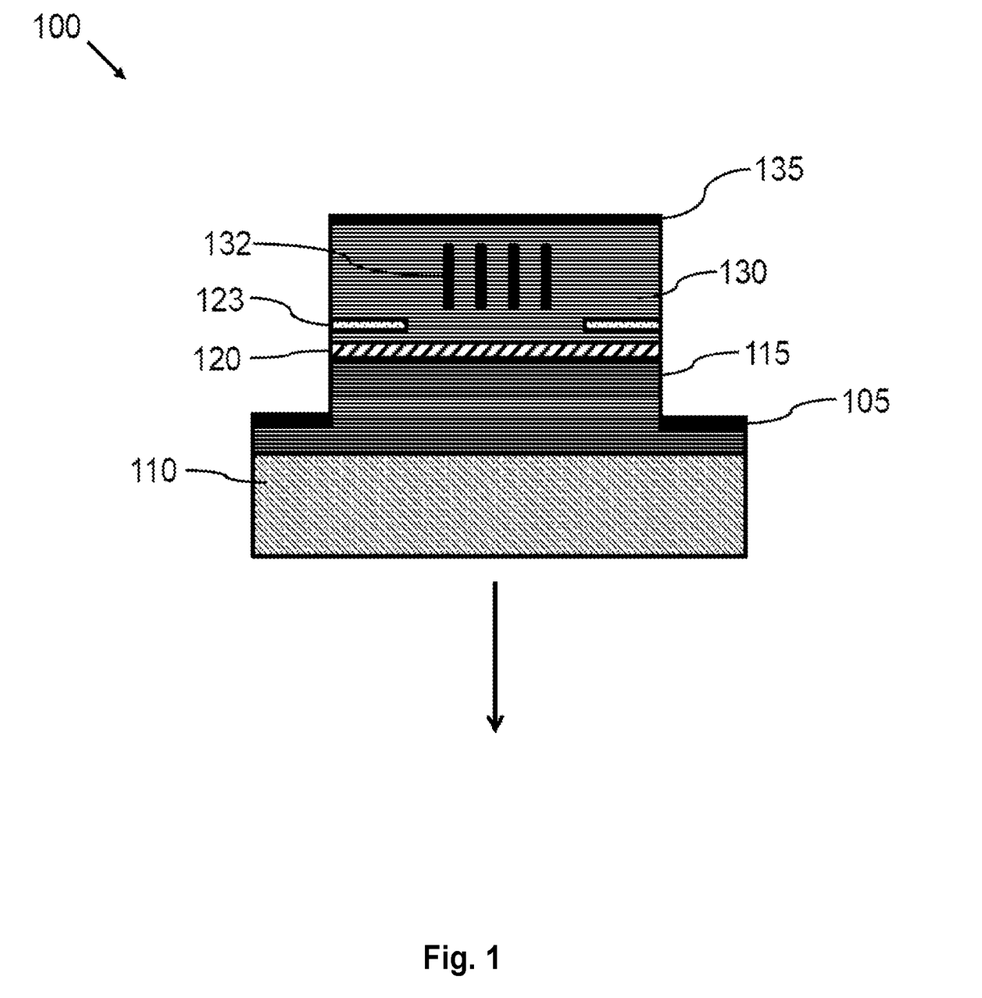
FIG. 1 shows a principal sketch of a cross-section of a first VCSEL device with a guiding structure.

FIG. 1 shows a principal sketch of a first VCSEL device 100 with guiding structure 132. The first VCSEL device 100 is a bottom emitting VCSEL emitting laser light through a substrate 110 (emission direction indicated by the arrow). The emission wavelength of the VCSEL device 100 has therefore to be arranged in a way that the (e.g. GaAs) substrate 110 is transparent with respect to the emission wavelength. On a first side of the substrate 110 is a first DBR 115 provided comprising 25 pairs of layers with a first and a second refractive index. The pairs of layers of the first DBR 115 comprise AlGaAs/GaAs layers. The thickness of the layers is adapted to the emission wavelength of the VCSEL in order to provide the requested reflectivity of around 98%. The first DBR 115 is partly etched in order to deposit a first electrical contact 105 (n-contact). The layer of the first DBR 115 on which the first electrical contact 105 is provided may be characterized by increased electrical conductivity (high doping) in order to distribute the electrical current in the lateral direction parallel to the layer structure of the VCSEL device 100 (current distribution layer). An active layer 120 is provided on top of the first DBR 115. A second DBR 130 is provided on top of the active layer 120. The second DBR 130 comprises 40 pairs of layers with a first and a second refractive index. The pairs of layers of the second DBR 130 again comprise AlGaAs/GaAs layers. The thickness of the pair of layers is adapted to the emission wavelength of the VCSEL in order to provide the requested reflectivity of more than 99.9%. A second electrical contact 135 (p-contact) covers the second DBR 130. A guiding structure 132 is integrated in the second DBR 130. The guiding structure 132 may comprise oxidized regions of one or more of the layers of the second DBR 130 in order to provide a lateral variation of the resonance condition across the active area 128 (see FIG. 3) of the active layer 121 as defined by the oxide aperture provided by the current confinement layer 123. The guiding structure 132 may alternatively or in addition comprise several layers of the second DBR 130 with varying doping profile to provide a lateral variation of electrical conductivity (subsequent proton implant, diffusion doping etc.). There may be one or more intermediate layers not shown for clarity reasons which may, for example, be used to match lattice constants.

Figure 2:
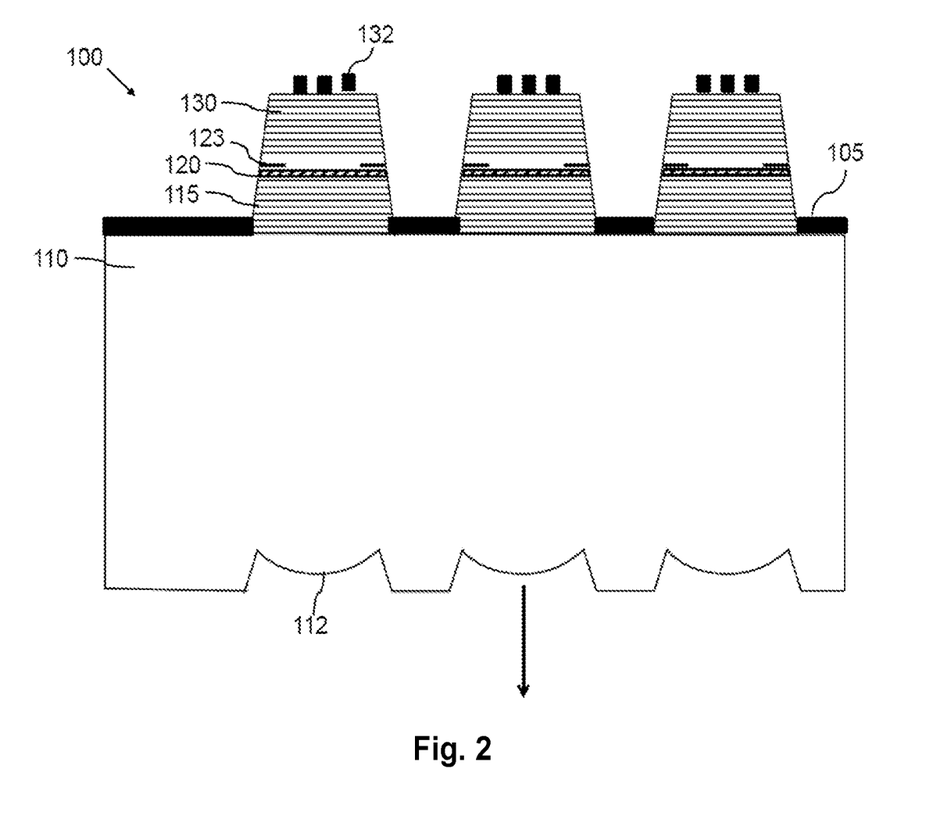
FIG. 2 shows a principal sketch of a cross-section of a second VCSEL device with a guiding structure.

FIG. 2 shows a principal sketch of a second VCSEL device 100 with guiding structure 132. The second VCSEL device 100 comprises an array of bottom emitting VCSELs which are arranged on a common substrate 110. Each VCSEL of the VCSEL array comprises a similar layer arrangement as described with respect to FIG. 1. Each VCSEL of the VCSEL array is coupled with a lens structure 112 etched in a second side of the substrate 110 opposing the first side of the substrate 110. The lens structure 112 is arranged to focus the laser light emitted via the second side of the substrate 110 (indicated by the arrow). The lens structure 112 further provides optical feedback due to the differences in refractive index (GaAs~3.4 and air 1). The lens structure 112 is therefore a part of the optical resonator and defines an extended optical cavity. Each VCSEL of the VCSEL array is therefore a Vertical Extended Cavity Surface Emitting Laser (VECSEL). A further difference with respect to the VCSEL device 100 shown in FIG. 1 is that the guiding structure 132 is not integrated in the second DBR 130. The guiding structure 132 comprises a structured second electrode. The structured second electrode provides local induction of electrical current in order to electrically pump separate relative intensity maxima such that there are a multitude of light emitting areas. Furthermore, the metal of the second electrode contributes to the reflectivity of the p-DBR and structures it laterally and therefore supports guiding in this respect to.

Figure 3:
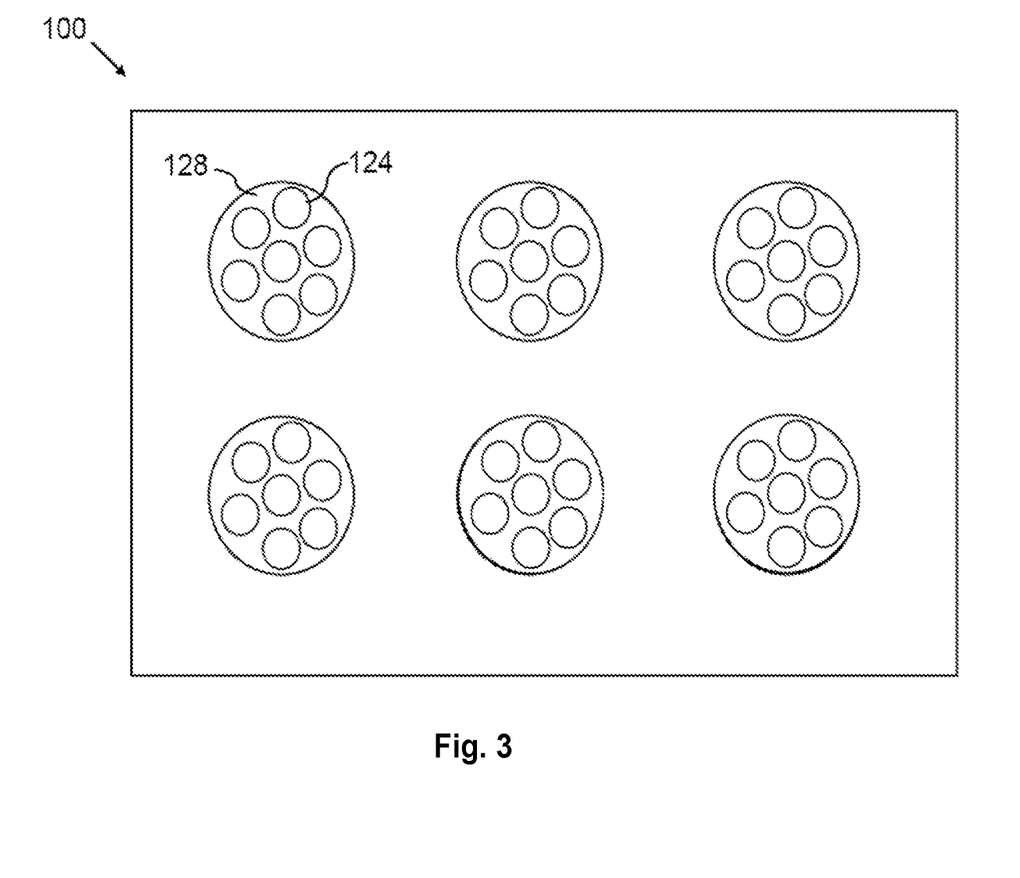
FIG. 3 shows a principal sketch of a top view of a third VCSEL device.

FIG. 3 shows a principal sketch of a top view of a third VCSEL device 100 across the active layer 120. The cross-section shows an array of six bottom emitting VCSELs across the active layer. The general configuration of each VCSEL is similar as discussed with respect to FIG. 1. The second electrical contact 135 fully covers the second DBR 130 (see also FIG. 4). The second electrical contact 135 contributes to the reflectivity of the second reflecting structure comprising the second DBR. The second electrical contact is arranged to provide a lateral variation of the reflectivity such that the resonance conditions vary laterally across the optical resonator in order to provide separate optical modes with distinct intensity profile such that there are seven light emitting areas 124 within the active area 128 of the respective active layer 120. Each VCSEL may optionally comprise a structured current distribution layer (not shown) supporting optical guiding by inducing the current at positions where the resonance conditions of the optical resonator enables emission of laser light. The cavity gain can be modified laterally by a different reflectivity of the mirrors in this case the second DBR 130 (p-DBR) as its surface is easy accessible to processing. Structuring of, for example, the cap-layer thickness (outmost layer in the second DBR) by etching, modification of the reflectivity of the second (metal) electrode 130 as discussed above or partial deposition of materials changing the reflectivity enable such a guiding structure. A specific class of such materials is dichroic materials, which would also enable local electrical isolation and/or variation of the optical feedback.

Figure 4:
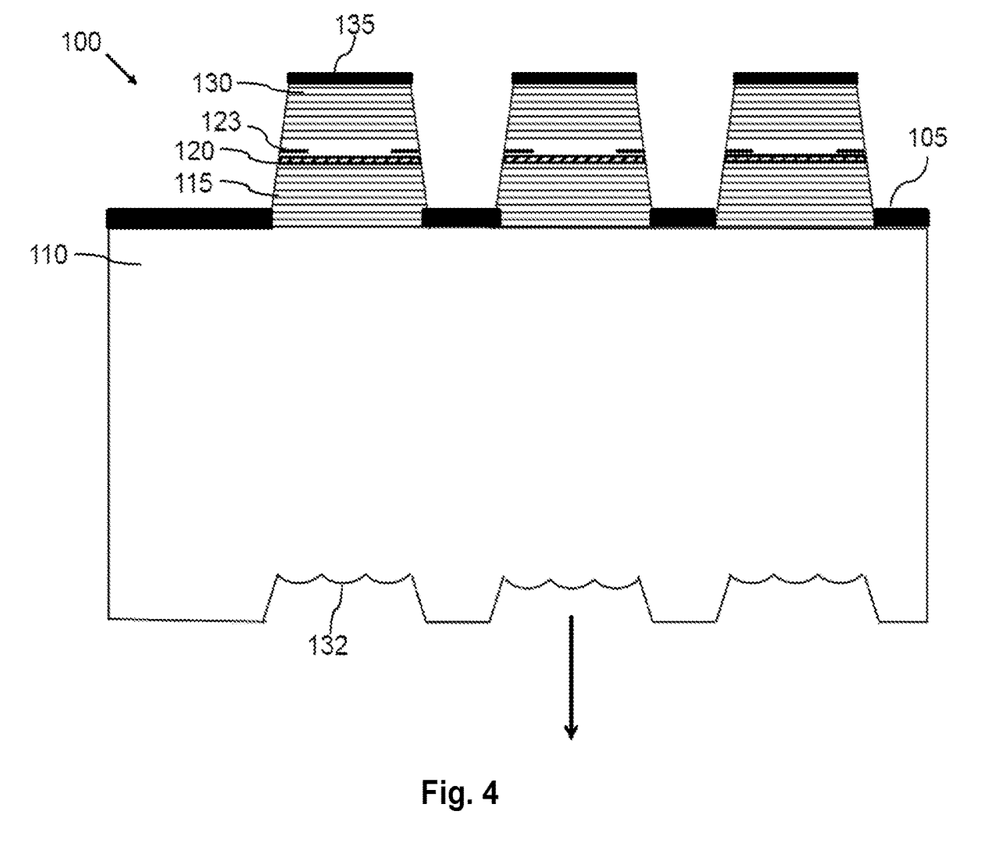
FIG. 4 shows a principal sketch of a cross-section of a fourth VCSEL device.

FIG. 4 shows a principal sketch of a fourth VCSEL device 100 with guiding structure 132. The arrangement is very similar as discussed with respect to FIG. 2. The second electrode 135 of the VCSELs of the VCSEL array fully covers the second DBR 130. The second side of the substrate 110 is in contrast to the embodiment discussed with respect to FIG. 2 arranged such that laterally varying optical feedback is provided across each active area. The second side of the substrate 110 is etched forming guiding structure 132. The localized external feedback of the guiding structure 132 across the respective active area enforces local (relative) intensity maxima of the intensity distribution in the active layer 120. Alternatively, a structured glass plate may be provided in order to enable such local optical feedback. It is possible to provide only a local modulation of the flat surface feedback i.e. regions with higher and lower reflectivity as discussed with respect to FIG. 3. It should be noted however that a stable cavity relies on a thermal lens developing in the material. Because of symmetry and the major influence of heat flow to the outside of the mesa of the respective VCSEL such thermal lens will most likely cover the whole bottom emitter and not show the desirable substructure. Therefore it can be advantageous to use a guiding structure 132 with many small curved mirrors as shown in FIG. 4 instead of a simple flat surface with modulated reflectivity. Another embodiment would be small microlenses and a flat (common) mirror forming the array of stable cavities inside the large electrically-pumped region of each VCSEL of the VCSEL array.

Figure 5:
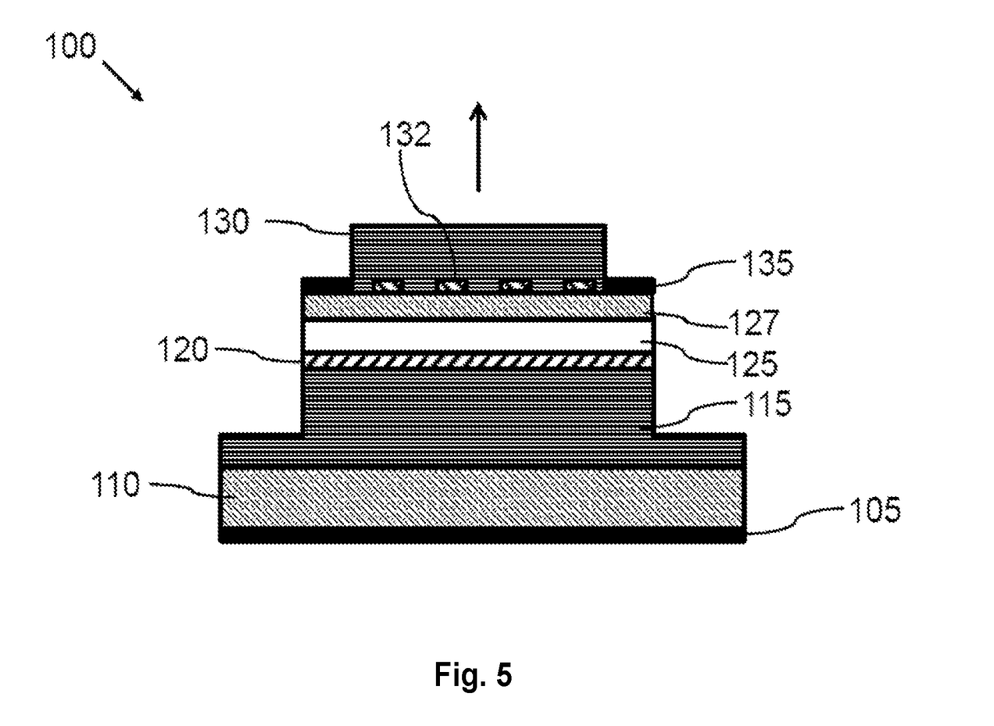
FIG. 5 shows a principal sketch of a cross-section of a fifth VCSEL device.

FIG. 5 shows a principal sketch of a cross-section of a fifth VCSEL device 100. The fifth VCSEL device 100 is a VCSEL emitting laser light away from the substrate 110 (top emitter, laser emission indicated by the arrow). On the second side of the substrate 110 a first electrical contact 105 is provided. On the first side of the substrate 110 is a first DBR 115 provided comprising 40 pairs of layers with a first and a second refractive index. The pairs of layers of the first DBR 115 comprise AlGaAs/GaAs layers. The thickness of the layers is adapted to the emission wavelength of the VCSEL device 100 in order to provide the requested reflectivity of more than 99.9%. On top of the first DBR 115 is an active layer 120 provided. The active layer 120 comprises a quantum well structure for light generation. An re-current injection layer (not shown) may be arranged between the first DBR 115 and the active layer 120. A distributed HPT 125 is provided on top of the active layer 120. A current spreading layer 127 is arranged on top of the distributed HPT 125. A second DBR 130 is provided on top of the current spreading layer 127. The second DBR 130 is a dielectric DBR comprising pairs of non-conducting dielectric layers with different refractive indices as, for example, $Nb_2O_5$, $TiO_2$, $TaO_2$, $Si_3N_4$ and $SiO_2$ layers. The number of pair of layers depends on the materials and the intended reflectivity. The thickness of the pair of layers is adapted to the emission wavelength of the VCSEL device 100 in order to provide the requested reflectivity of around 97%. A ring shaped second electrical contact 135 is arranged around the second dielectric DBR 130 above the current spreading layer. The VCSEL device 100 emits laser light in the direction of the arrow via the second dielectric DBR 130. The guiding structure 132 comprises a structured $SiO_2$ layer. The structured $SiO_2$ layer is embedded between the current spreading layer 127 and the second DBR 130. The $SiO_2$ layer is deposited on top of the current spreading layer 127 and subsequently etched to provide a lateral variation of optical feedback. The dielectric layers of the second DBR 130 are subsequently deposited on top of the structured $SiO_2$ layer and the current spreading layer 127 where the current spreading layer 127 was exposed by etching the $SiO_2$ layer. The structured $SiO_2$ layer locally increases the effective optical length and therefore the resonance condition of the optical resonator such that lasing is only enabled at the positions of remainders of the structured $SiO_2$ layer.

Figure 6:
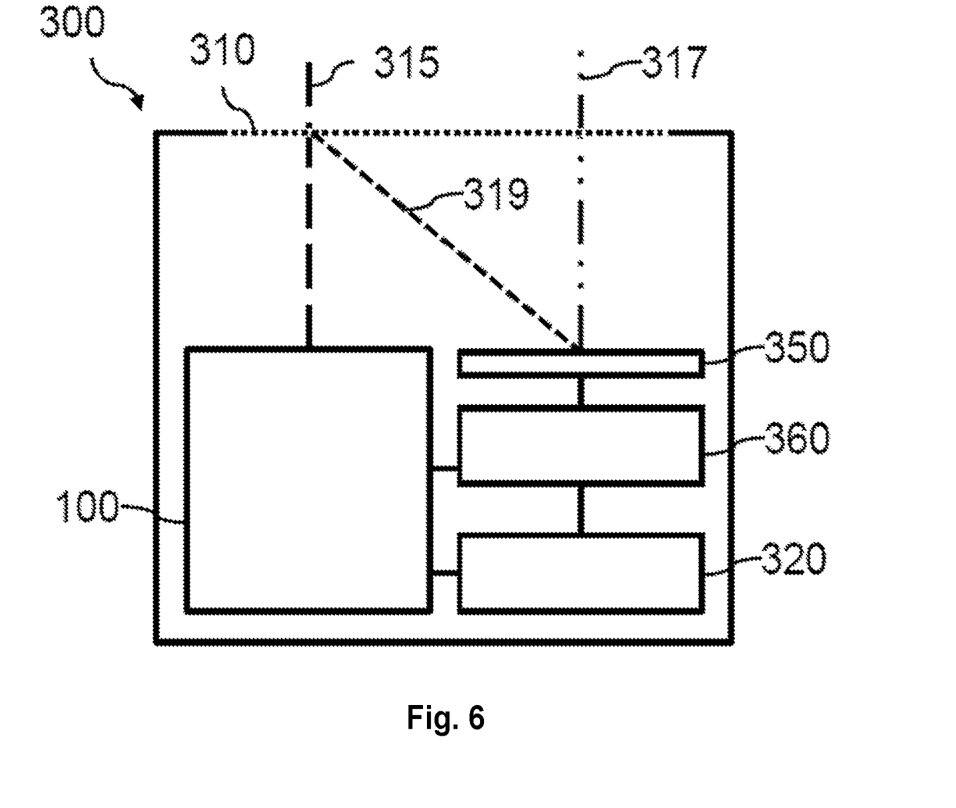
FIG. 6 shows a principal sketch of an optical sensor comprising the VCSEL device.

FIG. 6 shows a cross-section of an optical sensor 300. The optical sensor 300 comprises a VCSEL device 100 as described above, a transmission window 310 and a driving circuit 320 for electrically driving the VCSEL device 100. The driving circuit 320 is electrically connected to the VCSEL device 100 to supply electrical power to the VCSEL device 100 in a defined way. The driving circuit 320 comprises a memory device for storing data and instructions to operate the driving circuit 320 and a processing unit for executing data and instructions to operate the driving circuit 320. The optical sensor 300 further comprises a photo detector 350 and an evaluator 360. The photo detector 350 is in this case a photo diode but may be any preferably semiconductor device which can be used to detect laser light emitted by the VCSEL device 100. The photo detector 350 should be as sensitive as possible for the photons emitted by the VCSEL device 100 and should have a fast measurement time. A preferred technology are e.g. avalanche photodiodes or even more so called SPADs (single photon avalanche diodes) as well as arrays of the same. The evaluator 360 comprises at least one memory device like a memory chip and at least one processing device like a micro-processor. The evaluator 360 is adapted to receive data from the driving circuit 320, and optionally from photo detector 350 or VCSEL device 100 in order to determine a time t1 at which emitted laser light 315 leaves the optical sensor 300. The evaluator 360 further determines based on this time t1 and the repetition rate provided by means of the driving circuit 320 whether reflected laser light 317 detected by the photo diode originates from the laser pulse emitted at time t1. A time t2 is recorded if the reflected laser light 317 originates from the laser pulse and the distance to the object which reflected the laser pulse is calculated by means of the time of flight □t=t2-t1 and the velocity of the laser pulse c. A small part of the emitted laser light 315 may be reflected at the transmission window 310 and used as control signal 319. The control signal 319 is received by means of the photo-detector 350 much earlier than the reflected laser light 317. The evaluator 360 is therefore able to differentiate between reception of control signal 319 and reflected laser light 317. The signal strength of the received control signal 319 is compared by means of the evaluator 360 with a reference signal strength stored in the memory device of the evaluator 360. The evaluator 360 sends a power reduction signal to the driving circuit 320 as soon as the signal strength of the received control signal 319 exceeds a threshold value which is based on the reference signal strength in order to guarantee eye safety of the optical sensor 300. The time between reception of control signal 319 and reflected laser light 317 may be rather short. It may thus be favorable to use a separate control signal 319 independent from the emitted laser light 315. The separate control signal 319 may be a very short laser pulse emitted between two laser pulses of the emitted laser light 315. Furthermore, it may be favorable to implement a feedback structure in transmission window 310 such that the signal strength of control signal 319 is sufficiently high. The feedback structure may, for example, be a small piece of the surface of the transmission window 310 which is inclined with respect to the rest of the surface of the transmission window 310. Position and inclination angle are chosen such that the control signal 319 is directed to the photo-detector 350.

Figure 7:
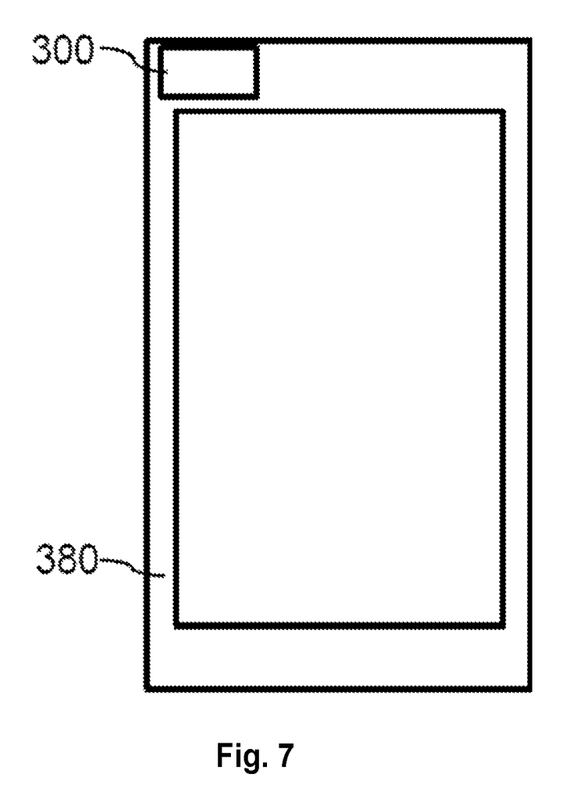
FIG. 7 shows a principal sketch of a mobile communication device comprising the optical sensor.

FIG. 7 shows a principal sketch of a mobile communication device 380 comprising an optical sensor 300 similar as described with respect to FIG. 6. The optical sensor 300 can, for example, be used in combination with a software application running on the mobile communication device 380. The software application may use the optical sensor 300 for sensing applications. Such sensing applications may be time of flight measurements for distance detection, camera autofocus, 3-D imaging of a scene or a gesture based user interface.

Figure 8:
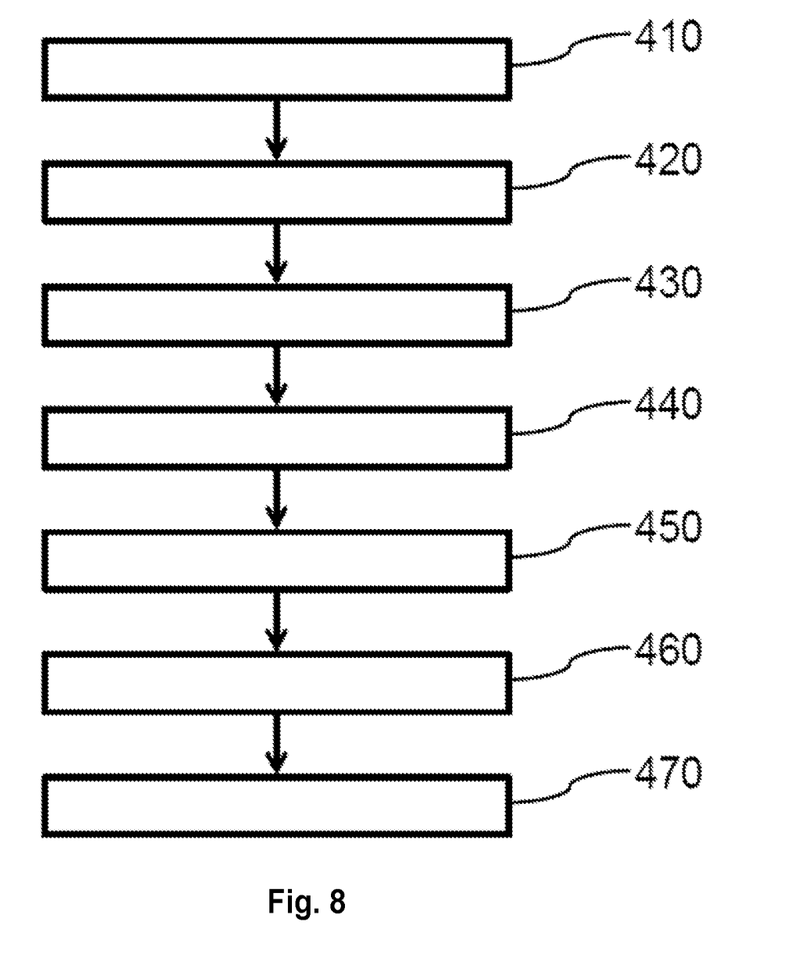
FIG. 8 shows a principal sketch of a process flow of a method of fabricating a VCSEL device.

FIG. 8 shows a principal sketch of a process flow of a method of fabricating a VCSEL device 100. A GaAs substrate 110 is provided in step 410. A first DBR 115 is provided on a first side of the substrate 110 in step 420 and an active layer 120 is provided in subsequent step 430 on top of the first DBR 115. A second DBR 130 provided in step 440 on top of the active layer 120. A first electrical contact 105 is provided in step 450. The first electrical contact 105 is attached to a second side of the substrate 110. A second electrical contact 135 is provided for electrically pumping the VCSEL device together with the first electrical contact 105 in step 460. A guiding structure 132 is provided step 470.

Further approaches to implement the guiding structure 132 may be as follows. Within a, for example, large diameter bottom emitter localized regions can be defined by oxidation. While the large diameter bottom emitter is created by mesa etching and oxidation from the outside of the mesa, for the local separation an oxidation can take place through small holes etched into the surface. This allows a narrow spacing of localized regions inside the large bottom emitter providing an optically almost continuous large emitter. It should be noted that even a non-perfect electrical isolation by the oxidation is tolerable as the optical separation with oxidized aluminum is very strong because of the large step in refractive index. Non-perfect electrical isolation therefore may reduce efficiency (as current is injected in non lasing regions) but the relative intensity maxima stay separated. The whole structure can have one continuous metal electrode connected to the electrical driver.

Electrical separation can also be achieved by proton-implantation, similar as described above but with the difference that proton-implantation does not induce a strong optical guiding effect. Electrical separation may be combined with some other method for optical guiding like methods as described above.

The sub-structure for localized optical modes can be introduced by a buried hetero-structure. This means that the wafer is taken out of the Epi-reactor during growth and laterally structured by lithography and etching. Afterwards the growth is completed. This yields only part of the DBR matching the resonance conditions.

The guiding structure 132 may be a gain guiding structure which can be designed by simply structuring the anode metal or the electrical connection of the semiconductor to this anode metal. The lateral conductivity of the p-DBR has to be kept low in order to maximize the separation of the relative intensity maxima (and corresponding optical mode or modes) by avoiding highly doped layers.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS

100 VCSEL device
105 first electrical contact
110 substrate
112 lens structure
115 first distributed Bragg reflector
120 active layer
123 current confinement layer
124 light emitting area
125 distributed heterojunction bipolar phototransistor
127 current spreading layer
128 active area
130 second distributed Bragg reflector
132 guiding structure
135 second electrical contact
300 optical sensor
310 transmission window
315 emitted laser light
317 reflected laser light
319 control signal
320 driving circuit
350 photo-detector
360 evaluator
380 mobile communication device
410 step of providing a substrate
420 step of providing a first distributed Bragg reflector
430 step of providing an active layer
440 step of providing a second distributed Bragg reflector
450 step of providing a first electrical contact
460 step of providing a second electrical contact
470 step of providing guiding structure

What is claimed is:

1. A Vertical Cavity Surface Emitting Laser (VCSEL) device, comprising:
   a first electrical contact;
   a substrate;
   a second electrical contact;
   an optical resonator arranged on a first side of the substrate; the optical resonator comprising:
      a first reflecting structure comprising a first distributed Bragg reflector,
      a second reflecting structure comprising a second distributed Bragg reflector,
      an active layer arranged between the first reflecting structure and the second reflecting structure, and
      a guiding structure configured (i) to define a first relative intensity maximum of an intensity distribution within the active layer at a first lateral position of the optical resonator such that a first light emitting area is provided, (ii) to define at least a second relative intensity maximum of the intensity distribution within the active layer at a second lateral position of the optical resonator such that a second light emitting area is provided, and (iii) to reduce an intensity of the intensity distribution in between the at least two light-emitting areas during operation of the VCSEL device,
   wherein the guiding structure is arranged within a layer stack of the first distributed Bragg reflector or the second distributed Bragg reflector and arranged within and fully enclosed by the optical resonator,
   wherein a first optical mode contributes to the first relative intensity maximum and a second optical mode, which is different from the first optical mode, contributes to the second relative intensity maximum, and
   wherein the guiding structure comprises a variation of a thickness of at least one layer of the first distributed Bragg reflector or the second distributed Bragg reflector.

2. The VCSEL device according to claim 1, wherein the guiding structure is arranged inside a layer stack of the first distributed Bragg reflector or the second distributed Bragg reflector in a vertical direction of the VCSEL device.

3. The VCSEL device according to claim 1, wherein the guiding structure is configured to reduce an intensity of at least one optical mode contributing to at least one of the first or second relative intensity maximum outside the at least the first or the second light emitting area such that a lateral extension of the light emitting areas is bound to the respective lateral position of the optical resonator.

4. The VCSEL device according to claim 1, wherein the guiding structure is configured to provide a lateral variation of a reflectivity of the first reflecting structure or the second reflecting structure parallel to the active layer.

5. The VCSEL device according to claim 1, wherein the guiding structure comprises a lateral variation of a reflectivity of the first electrical contact or the second electrical contact.

6. The VCSEL device according to claim 1, wherein the guiding structure comprises oxidized regions within at least one layer of the first distributed Bragg reflector or the second distributed Bragg reflector, wherein the oxidized regions are arranged to reduce the intensity in between the light-emitting areas.

7. The VCSEL device according to claim 1, wherein the optical resonator further comprises a distributed heterojunction bipolar phototransistor comprising:
 a collector layer,
 a light sensitive layer,
 a base layer, and
 an emitter layer,
 wherein the distributed heterojunction bipolar phototransistor is arranged such that there is an optical coupling between the active layer and the distributed heterojunction bipolar phototransistor for providing an active carrier confinement the distributed heterojunction bipolar phototransistor.

8. The VCSEL device according to claim 7, wherein the guiding structure is arranged outside a current flow configured to be provided by the first electrical contact and the second electrical contact during operation of the VCSEL device.

9. The VCSEL device according to claim 1, wherein the guiding structure is further configured to provide across the lateral cross section of the optical resonator regions with an effective optical length enabling resonant laser operation intermitted by regions with a different effective optical length inhibiting laser operation.

10. The VCSEL device according to claim 1, wherein the guiding structure is further configured to provide a local current confinement at the light-emitting areas.

11. The VCSEL device according to claim 1, wherein the optical resonator comprises an extended optical cavity across the substrate, and wherein the guiding structure comprises a lateral structuring of a second side of the substrate opposing the first side of the substrate.

12. An optical sensor comprising the VCSEL device according to claim 1.

13. A mobile communication device comprising at least one optical sensor according to claim 12.

14. A method of fabricating a Vertical Cavity Surface Emitting Laser (VCSEL), the method comprising the steps of:
 providing a first electrical contact;
 providing a substrate;
 providing a first distributed Bragg reflector;
 providing an active layer;
 providing a second distributed Bragg reflector;
 providing a second electrical contact; and
 providing a guiding structure configured (i) to define a first relative intensity maximum of an intensity distribution within the active layer at a first lateral position of the optical resonator such that a first light emitting area is provided, (ii) to define at least a second relative intensity maximum of the intensity distribution within the active layer at a second lateral position of the optical resonator such that a second light emitting area is provided, (iii) to reduce an intensity of the intensity distribution in between the at least two light-emitting areas during operation of the VCSEL device,
 wherein the guiding structure is arranged within a layer stack of the first distributed Bragg reflector or the second distributed Bragg reflector and arranged within and fully enclosed by the optical resonator,
 wherein a first optical mode is contributing to the first relative intensity maximum and a second optical mode, which is different from the first optical mode, is contributing to the second relative intensity maximum, and
 wherein the guiding structure comprises:
  a variation of a thickness of at least one layer of the first distributed Bragg reflector or the second distributed Bragg reflector, or
  a lateral variation of a reflectivity of the first electrical contact or the second electrical contact.

15. The method according to claim 14, wherein the guiding structure comprises the lateral variation of the reflectivity of the first electrical contact or the second electrical contact.

16. The method according to claim 14, wherein the guiding structure comprises the variation of the thickness of at least one layer of the first distributed Bragg reflector or the second distributed Bragg reflector.

17. A Vertical Cavity Surface Emitting Laser (VCSEL) device, comprising:
 a first electrical contact;
 a substrate;
 a second electrical contact;
 an optical resonator arranged on a first side of the substrate; the optical resonator comprising:
  a first reflecting structure comprising a first distributed Bragg reflector,
  a second reflecting structure comprising a second distributed Bragg reflector,
  an active layer arranged between the first reflecting structure and the second reflecting structure, and
  a guiding structure configured (i) to define a first relative intensity maximum of an intensity distribution within the active layer at a first lateral position of the optical resonator such that a first light emitting area is provided, (ii) to define at least a second relative intensity maximum of the intensity distribution within the active layer at a second lateral position of the optical resonator such that a second light emitting area is provided, and (iii) to reduce an intensity of the intensity distribution in between the at least two light-emitting areas during operation of the VCSEL device,
 wherein the guiding structure is arranged within a layer stack of the first distributed Bragg reflector or the second distributed Bragg reflector and arranged within and fully enclosed by the optical resonator,
 wherein a first optical mode contributes to the first relative intensity maximum and a second optical mode, which is different from the first optical mode, contributes to the second relative intensity maximum, and
 wherein the guiding structure comprises a lateral variation of a reflectivity of the first electrical contact or the second electrical contact.

* * * * *